(12) United States Patent
Goto et al.

(10) Patent No.: US 7,189,946 B2
(45) Date of Patent: Mar. 13, 2007

(54) SUBSTRATE HEATING DEVICE

(75) Inventors: Yoshinobu Goto, Nagoya (JP);
Hideyoshi Tsuruta, Tokai (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 11/102,462

(22) Filed: Apr. 8, 2005

(65) Prior Publication Data

US 2005/0258160 A1   Nov. 24, 2005

(30) Foreign Application Priority Data

Apr. 12, 2004   (JP)   ............................ P2004-117237

(51) Int. Cl.
*H05B 3/68* (2006.01)
*H05B 3/44* (2006.01)
(52) U.S. Cl. .................... 219/444.1; 219/544
(58) Field of Classification Search ............. 219/443.1, 219/444.1, 462.1, 465.1, 466.1, 467.1, 468.1, 219/468.2, 543, 544; 118/424, 425
See application file for complete search history.

(56) References Cited

U.S. PATENT DOCUMENTS

| 2,007,111 | A | * | 7/1935 | Morgan ....................... 219/544 |
| 2,799,765 | A | * | 7/1957 | Jenkins et al. ........... 219/468.2 |
| 6,669,784 | B2 | * | 12/2003 | Futamura et al. ........... 118/729 |
| 6,730,175 | B2 | * | 5/2004 | Yudovsky et al. .......... 118/728 |
| 6,921,881 | B2 | * | 7/2005 | Ito et al. ...................... 219/544 |
| 2004/0206746 | A1 | | 10/2004 | Zhou |
| 2005/0045618 | A1 | | 3/2005 | Ito |

FOREIGN PATENT DOCUMENTS

| JP | 2001-052843 | 2/2001 |
| JP | 2003-077783 | 3/2003 |
| TW | 526671 | 4/2003 |
| TW | 569643 | 1/2004 |

* cited by examiner

*Primary Examiner*—Sang Paik
(74) *Attorney, Agent, or Firm*—Burr & Brown

(57) ABSTRACT

A substrate heating device is provided, including a ceramic base plate having a heating surface on which a substrate is placed, resistance heating elements buried in the ceramic base plate corresponding to a plurality of zones into which the heating surface is divided, terminals respectively connected to the resistance heating elements, and lead wires respectively connected to the terminals and wired on an outer surface of the ceramic base plate other than the heating surface.

13 Claims, 6 Drawing Sheets

SUBSTRATE HEATING DEVICE

CROSS REFERENCE TO RELATED APPLICATIONS

This application is based upon and claims the benefit of priority from prior Japanese Patent Application No. 2004-117237, filed on Apr. 12, 2004; the entire contents of which are incorporated herein by reference.

BACKGROUND OF THE INVENTION

1. Field of the Invention

The present invention relates to a substrate heating device, which heats a substrate such as a semiconductor substrate, a liquid crystal substrate or the like. More specifically, the present invention relates to a substrate heating device which includes a ceramic base plate and resistance heating elements buried in the ceramic base plate.

2. Description of the Related Art

A ceramic heater which has a ceramic base plate and resistance heating elements buried in the ceramic base plate is widely used as a substrate heating device in a semiconductor manufacturing process or the like. The ceramic heater used in a semiconductor manufacturing process or the like is available over a wide range of temperatures for applications. Uniform heat on the heating surface of the heater is desired for increasing yield of semiconductor products.

In many ceramic heaters, a single resistance heating element, which is provided by forming a single continuous linear resistance heating element into a coil shape, is buried in the ceramic base plate. Recently, a multi-zone heater having independent resistance heating elements buried in respective zones into which the heating surface is divided has been adopted. A heating value may be specified for each zone in the multi-zone heater, thereby providing improved uniformity of heater surface temperature. A multi-zone heater with resistance heating element buried in respective nine zones of the ceramic base plate is disclosed in Japanese Patent Application Laid-Open No. 2001-52843, FIG. 1.

In the conventional multi-zone heater, terminals are connected to the respective resistance heating elements. Lead wires are connected to the respective terminals and are connected to a power supply line. In the conventional ceramic heater, the lead wires are also buried in the ceramic base plate. Therefore, the lead wires are wired in the ceramic base plate and connected to the power supply line at the central of the underside of the ceramic base plate.

Meanwhile, in this case, since the buried lead wires themselves may become defects of the ceramic base plate, the thinnest available wire must be used as lead wires to prevent generating stress. In addition, in the manufacturing process for the ceramic base plate, since a ceramic compact in which lead wires are buried is sintered, the lead wires must be made of a sintering temperature-proof refractory metal.

Therefore, conventionally, a refractory metal having a high volume resistivity has been used for lead wires as with a resistance heating element material. As a result, the lead wires generate heat as with the resistance heating element. When extending the respective lead wires to the central of the ceramic base plate, the lead wires must always be arranged to pass through other zones. Therefore, it is difficult to precisely control the temperatures of the respective zones due to influence of heat generation of the lead wires.

SUMMARY OF THE INVENTION

An object of the present invention is to provide a substrate heating device including resistance heating elements for the respective zones into which a heating surface is divided, which can prevent influences of lead wires and precisely control temperature for respective zones.

A substrate heating device according to one embodiment of the present invention includes a ceramic base plate having a heating surface on which a substrate is placed, resistance heating elements buried in the ceramic base plate for respective zones into which the heating surface is divided, terminals connected to the resistance heating elements respectively, and lead wires connected to the terminals respectively and wired on an outer surface of the ceramic base plate other than the heating surface.

According to such a substrate heating device, the lead wires connected to respective terminals of the resistance heating elements are not buried in the ceramic base plate and are wired on an outer surface of the ceramic base plate other than the heating surface, in the substrate heating device having resistance heating elements for the respective zones into which the heating surface is divided. Therefore, undesirable influences of lead wires can be prevented and precise temperature control for the respective zones can be achieved.

DETAILED DESCRIPTION OF THE INVENTION

A substrate heating device according to a first embodiment of the present invention is a ceramic heater including resistance heating elements buried in a ceramic base plate. More specifically, it is a multi-zone heater with independent resistance heating elements buried in respective zones into which a heating surface is divided. A substrate is placed on the heating surface. Lead wires connected to respective terminals of the resistance heating elements are not buried in the ceramic base plate, and are wired on an outer surface of the ceramic base plate other than the heating surface.

Figure 1A:
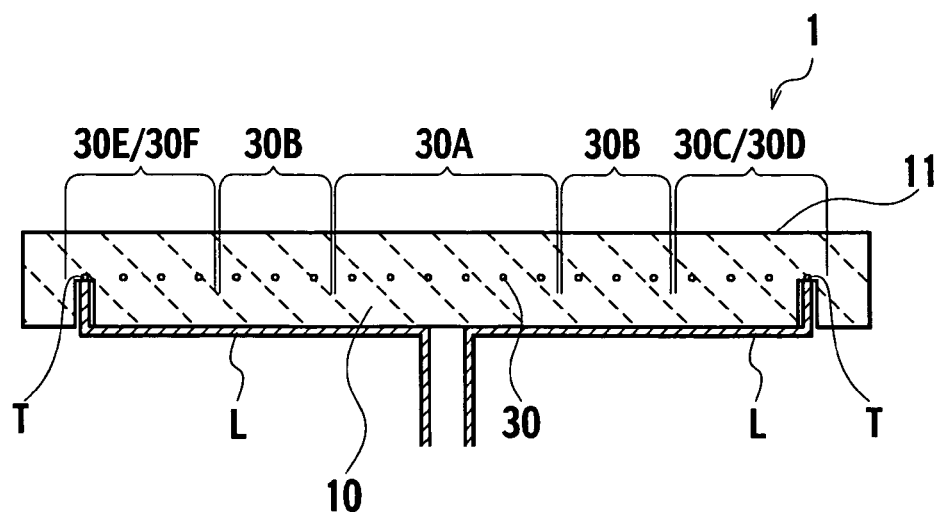
FIG. 1A is a sectional view of a substrate heating device, according to a first embodiment of the present invention.
Figure 1B:
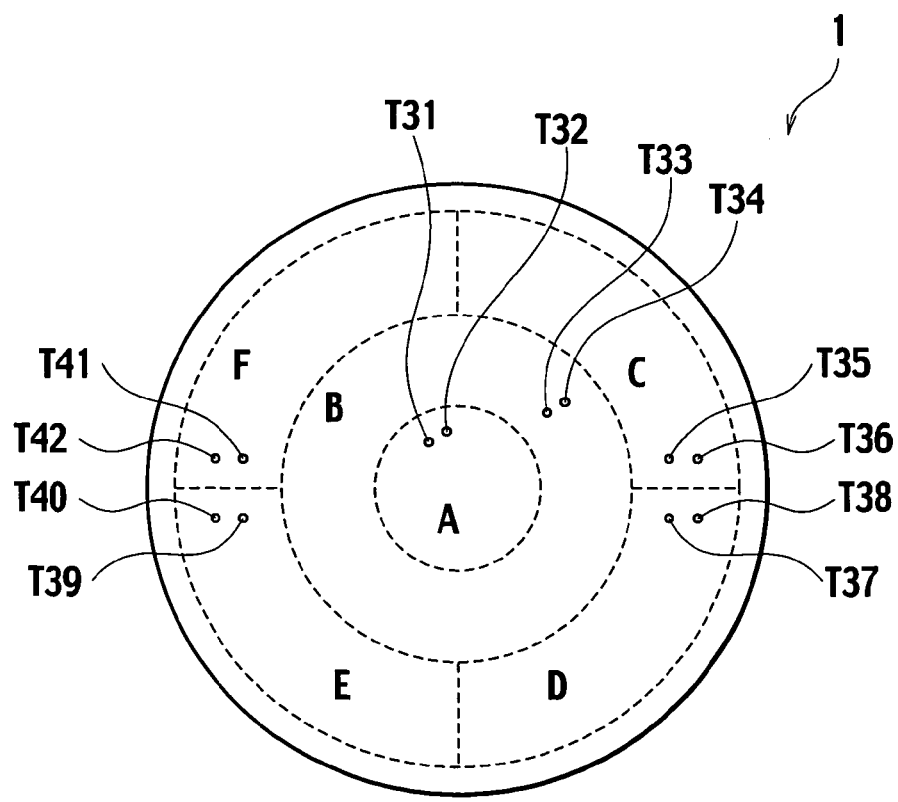
FIG. 1B is a plan view showing divided zones of a heating surface.

FIG. 1A is a sectional view of the substrate heating device 1 according to the first embodiment of the present invention. FIG. 1B is a plan view showing an example of the heating surface having divided multiple zones. Note that through-holes for lift pins or the like are not shown in the drawing for convenience, however, those are formed as needed.

As shown in FIG. 1A, the substrate heating device 1 according to the first embodiment includes a disc-shaped ceramic base plate 10 having a heating surface 11 on which a substrate is placed, and resistance heating elements 30, which are buried in the ceramic base plate 10. As shown in FIG. 1B, the resistance heating elements 30 include multiple resistance heating elements 30A through 30F for the six respective zones A through F into which the heating surface 11 is divided. In other words, the substrate heating device 1 includes the resistance heating elements 31A through 30F for the respective zones into which the heating surface 11 is divided. The resistance heating elements 30A through 30F are connected to respective independent terminals T31 through T41 for resistance heating elements 30A through 30F. Note that the term 'resistance heating elements 30' means an unspecified resistance heating element or an entirety of resistance heating elements. In addition, the same applies for the term 'terminals T', and the term 'lead wires L'.

The heating surface 11 may be arbitrarily divided into multiple zones. For example, as shown in FIG. 1B, the heating surface 11 may be divided in the in-plane direction into a first zone A at the central region, a second zone B arranged in the periphery of the first zone, and a third zone including four zone groups C through F equally divided along the circumferential direction in the periphery of the second zone. As a result, the heating surface 11 has six divided zones altogether. The independent resistance heating elements 30A through 30F are buried in the respective zones of the ceramic base plate 10. Appropriate voltages and electric currents for the respective zones are supplied to the respective resistance heating elements 30A through 30F, and respective heating values are adjusted.

For example, in the vicinity of the periphery of the heating surface 11, the temperature tends to depend on the surrounding of the substrate heating device 1, as opposed to that of the central region of the heating surface 11. In addition, a tubular member or the like is often connected to the central region in the underside of the ceramic base plate 10. As a result, the heating surface 11 temperature tends to decrease due to the influence of the heat conduction to the tubular member. As described above, since the heating conditions differ among those zones, it is preferable that the heating values for the respective zones are adjusted to respective appropriate values so as to provide uniform temperature of the heating surface 11.

Note that the heating surface 11 may be divided into two zones: an inner zone that is in the vicinity of the central region of the heating surface 11, and an outer zone that is the periphery of that inner zone. In addition, the periphery of the second zone shown in FIG. 1B may be divided into five zones or more, for example, six zones or eight, which constitute the third zone group. Moreover, the periphery of the second zone may be divided into differently sized zones. Furthermore, in addition to division of the heating surface 11 into multiple zones, multiple resistance heating elements may be buried in a direction perpendicular to the heating surface 11 and the ceramic base plate 10 may be divided in the vertical direction into multiple zones.

As shown in FIG. 1B, the terminals T31 through T41 of the respective resistance heating elements 30A through 30F are connected to the respective resistance heating elements 30A through 30F. More specifically, sets of two terminals (T31, T32), (T33, T34), (T35, T36), (T37, T38), (T39, T40), and (T41, T42) are connected to the respective resistance heating elements 30A through 30F, which allows specifying independent electric current values and voltage values, respectively, and which allows control of respective heating values. The terminals T supply electric power from power supply member such as a power supply line or a power supply rod to the resistance heating elements 30.

Furthermore, as shown in FIG. 1A, the lead wires L connected to the respective terminals T are not buried in the ceramic base plate 10, and are wired on the outer surface of the ceramic base plate 10 other than the heating surface 11. More specifically, the lead wires L are wired on the underside i.e., the opposite surface of the ceramic base plate 10 to the heating surface 11. For example, the lead wires L are wired on the underside of the ceramic base plate 10 and collected up the central region of the underside of the ceramic base plate 10. Note that the lead wires L are wired on the underside (the opposite surface to the heating surface 11) of the ceramic base plate 10. Alternatively, the lead wires L may be wired on an arbitrary outer surface other than the heating surface 11, for example, on the side surface of the ceramic base plate 10.

Figure 2A:
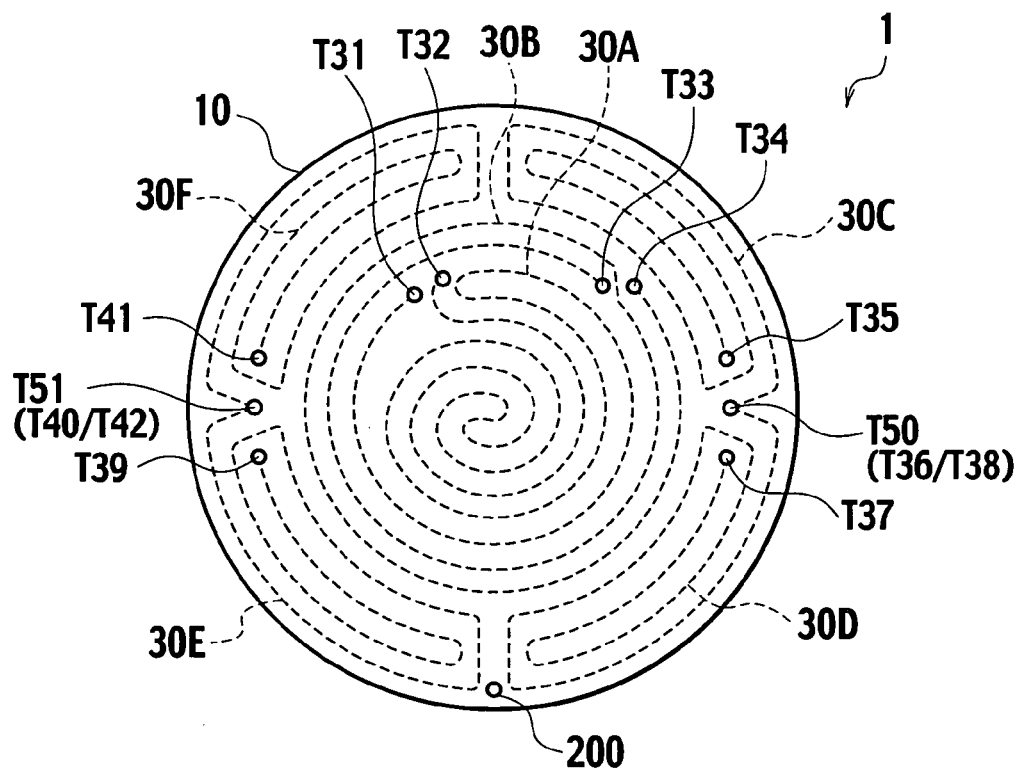
FIG. 2A is a plan view showing a resistance heating element buried pattern of the substrate heating device according to the first embodiment of the present invention.

FIG. 2A is a plan view showing a layout of the resistance heating elements 30A through 30F buried in the respective zones A through F. As shown, it is preferable that each of the resistance heating elements 30 has a coil-shape formed by bending and coiling a linear conductor. Note that when through-holes for introducing purge gas or through-holes for lift pins to be inserted are formed in the ceramic base plate 10, it is preferable to provide a pattern of resistance heating elements diverting in areas adjacent to those through-holes. In addition, FIG. 1B shows the substrate heating device having two independent terminals for respective zones. Alternatively, terminals in adjacent zones may be shared as a common terminal. This allows a further simplified layout of the lead wires L. For example, as shown in FIG. 2A, a common terminal T50 may be shared by adjacent zones 30C and 30D while a common terminal T51 may be shared by adjacent zones 30E and 30F. More specifically, the terminals T40 and T42 in FIG. 1B may be combined into the terminal T51, and the terminals T36 and T38 in FIG. 1B may be combined into the terminal 50.

Figure 2B:
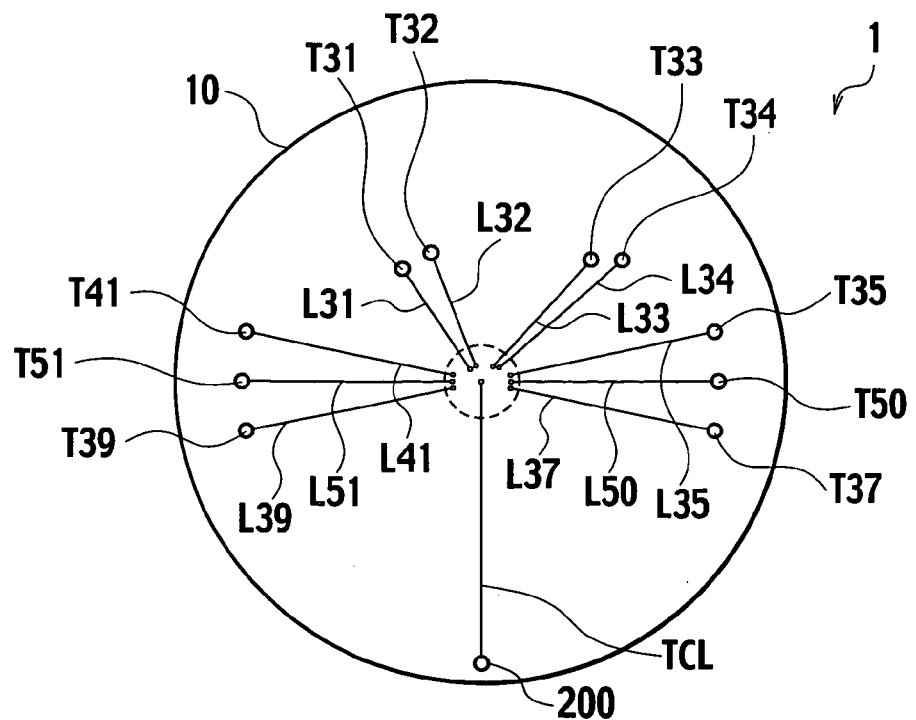
FIG. 2B is a plan view showing an arrangement of lead wires connected to terminals of the respective resistance heating elements on the underside of a ceramic base plate.

FIG. 2B is a plan view showing an arrangement of the lead wires L connected to the terminals T of the respective resistance heating elements 30 on the underside of the ceramic base plate 10. In the substrate heating device 1, the terminals T of the resistance heating elements 30A through 30F may be connected to the respective lead wires L by soldering or screwing. The respective lead wires L are wired on the underside (the opposite surface to the heating surface 11) of the ceramic base plate 10. In other words, the lead wires L are not buried in the ceramic base plate 10, and are wired on the underside which is the outer surface other than the heating surface of the ceramic base plate 10. For example, the lead wires L31 through L35, L37, L39, L41, L50, and L51 connected to the respective terminals T31 through T35, T37, T39, T41, T50, and T51 are collectively wired in one location as if crawling on the underside of the ceramic base plate 10. Note that the respective lead wires L are not necessarily collectively wired in one location, however, if they are collectively wired as described above, the lead wires L may be easily connected to the power supply member such as a power supply line, and the surrounding area of the substrate heating device 1 may be neatly organized, allowing sufficient space in the vicinity thereof.

As described above, in the substrate heating device 1, the lead wires L, which have conventionally been buried in the ceramic base plate 10 together with the resistance heating elements 30, are not buried in the ceramic base plate 10, and are wired on an outer surface of the ceramic base plate 10 instead. Therefore, the substrate heating device 10 can prevent influences of lead wires L and precisely control temperature for respective zones.

More specifically, the lead wires L are not defects of the ceramic base plate 10. In addition, it is unnecessary to carry out sintering while the lead wires are buried. As a result, the diameters and materials of the lead wires L are not limited. This allows the use of a conductor material having a lower resistance, such as a metallic wire made of Ni or Al, i.e., a nickel wire, or an aluminum wire for the lead wires L. As a result, heat generation of the lead wires L themselves may be prevented, thereby preventing influences on temperature control due to heat generation of the lead wires L. More specifically, heat generation of the lead wires L does not influence the temperatures of the resistance heating elements 30 and the heating surface 11. This allows for further precise temperature control for each zone of the heating surface 11.

Note that as shown in FIGS. 2A and 2B, a thermocouple (TC) 200 may be provided in the ceramic base plate 10 as necessary. In this case, a lead wire TCL connected to the thermocouple 200 may be wired on an outer surface, for example, the underside of the ceramic base plate 10.

Next, the respective parts in the substrate heating device 1 are described in further detail. The material of the ceramic base plate 10 is not limited, and aluminum nitride (AlN), alumina ($Al_2O_3$), silicon nitride (SiNx), silicon carbide (SiC), mullite ($Al_6Si_2O_{13}$), boron nitride (BN), sialon ($Si_{6-z}Al_zO_zN_{8-z}$) and the like may be used. Of these, aluminum nitride is preferably used. As a result, a further increase in the temperature uniformity of the heating surface 11 can be achieved, because aluminum nitride has high thermal conductivity. Therefore, it is preferable that the ceramic base plate 10 includes aluminum nitride, and further preferable that it includes aluminum nitride as a main ingredient.

The shape of the ceramic base plate 10 is not limited to the disc shape shown in FIGS. 1A and 1B. For example, the ceramic base plate 10 may have a rectangular plane or a polygon plane shape according to the shape of the substrate to be placed on the heating surface 11. The heating surface 11 is not limited to being a flat surface, and may be embossed, grooves for positioning the substrate may be formed in accordance with the substrate size, or channels for introducing purge gas to the heating surface 11 may be formed. In addition, guide channels for wiring the lead wires L, i.e., guide channels in which the lead wires L are housed, may be formed on the underside of the ceramic base plate 10. Furthermore, through-holes for introducing purge gas to the heating surface 11 or through-holes for lift pins to be inserted may be formed on the ceramic base plate 10.

The material of the resistance heating elements 30 is not limited, and a refractory conductive material such as molybdenum (Mo), tungsten (W), molybdenum carbide (MoC), or tungsten carbide (WC) is preferred. Materials other than refractory conductive materials, such as Ni, TiN, TiC, TaC, NbC, HfC, $HfB_2$, $ZrB_2$, or carbon are also available. It is preferable that the resistance heating elements 30 include at least one of molybdenum and tungsten, and is further preferable to include molybdenum or tungsten as a main ingredient. In addition, the form of the resistance heating elements 30 is not limited. Other than the wire shown in FIG. 2A, resistance heating element such as a ribbon, a mesh, a coil spring, a sheet, a printed resistance heating element formed by printing a printing paste including resistance heating element material, and a thin film of resistance heating element material formed by chemical vapor deposition (CVD) or physical vapor deposition (PVD) such as vapor deposition or sputtering are available.

Since the resistance heating elements 30 are buried in the ceramic base plate 10, in other words, the base is made of highly corrosion-proof ceramics, and the resistance heating elements are not externally exposed, the substrate heating device 1 is highly corrosion proof. Therefore, it is preferable to use the substrate heating device 1 in a chemical vapor deposition (CVD) apparatus or a dry etching apparatus, which often use a corrosive gas.

In addition, it is preferable that the lead wires L are made of a low-resistance metallic wire, for example, a nickel (Ni) wire or an aluminum (Al) wire. It is preferable that the diameter of the lead wire is from about 0.5 mm to about 10 mm. The form of the lead wires L is not limited. Other than the wire made of lead wire material, a printing lead formed by printing a printing paste including lead wire material, and a thin film of lead wire material formed by CVD or PVD such as vapor deposition or sputtering are available.

Next, a method for manufacturing the substrate heating device 1 according to the first embodiment is described. First, the ceramic base plate 10 is formed in which the resistance heating elements 30 connected to the terminals T are buried. Next, the lead wires L are connected to the respective terminals T and wired on an outer surface other than the heating surface 11 of the ceramic base plate 10, for example, on the underside of the ceramic base plate 10 (the opposite surface to the heating surface 11). Next, steps of the manufacturing method are described in further detail.

The ceramic base plate 10 is formed by preparing a ceramic compact in which the resistance heating element 30 connected to the respective terminals T are buried and then sintering it. A ceramic powder made by adding a rare-earth oxide such as yttrium, which is used as a sintering aid, to a main ingredient such as aluminum nitride, silicon carbide, silicon nitride, mullite, sialon or the like. First, a slurry is made by beating and mixing a binder, a dispersing agent, water, etc. as necessary with the ceramic powder. The resulting slurry is granulated with a spray dryer. The resulting granules are filled in a mold and pressed, forming a preform. The coil-shaped resistance heating elements 30 connected to the terminals T into which heating surface 11 is divided are placed on the preform in respective zones. A ceramic compact in which the resistance heating element 30 connected to the terminals T are buried is formed by filling the ceramic powder on the preform and the resistance heating elements 30 and then press-forming. At this time, grooves may be formed in advance at positions on the preform where the resistance heating elements 30 are to be placed, and afterwards, the resistance heating elements 30 may be placed in those respective grooves.

Next, the ceramic compact is sintered by hot pressing or atmospheric sintering, for example. For example, in the case of using an aluminum nitride powder as the ceramic powder, it is sintered for about one to about ten hours at a temperature of about 1700° C. to about 2000° C. in a nitrogen atmosphere. In the case of hot pressing, pressure of about 20 kgf/cm² to about 100 kgf/cm², more preferably about 100 kgf/cm² to about 400 kgf/cm² is applied. Since pressure is applied in a uniaxial direction when sintering using the hot pressing method, excellent adhesiveness of the resistance heating elements 30 and the surrounding ceramic base plate 10 can be provided. Furthermore, when using a metallic bulk as the resistance heating elements 30, there is no deformation made by the applied pressure when hot press sintering. In this manner, the ceramic base plate 10 which is a disc-shaped ceramic sintered body with a diameter of about 200 mm to about 400 mm can be obtained.

Holes are formed in the ceramic base plate 10 in which the resistance heating elements 30 connected to the respective terminals T are buried so as to expose the terminals T of the respective buried resistance heating elements. The exposed terminals T are connected to the ends of the lead wires L by soldering, welding or the like. The lead wires L are then wired on the underside (the opposite surface to the heating surface 11) of the ceramic base plate 10. The lead wires may be fixed to the underside of the ceramic base plate 10 using an insulating adhesive or the like or by tightening screws at several places. Furthermore, in the case of forming the lead wires L by printing, a printing paste such as a Ni paste is patterned on the underside of the ceramic base plate 10 by screen printing and is then sintered. In this case, the lead wires should be connected to the respective terminals T of the resistance heating elements 30 by soldering or the like. Note that the arrangement of the lead wires L is not limited to collectively wiring them in the central region on the underside of the ceramic base plate 10. Alternatively, an optimum position should be determined depending on the arrangement of the surrounding area of the substrate heating device 1, such as connection with power supply member or positional relationships with units provided therearound.

Note that in a hole-punching process, the heating surface 11 is embossed by sandblasting or the like, grooves are formed for placing the substrate on the heating surface 11, or through-holes or channels, which are for introducing purge gas to the heating surface 11, or through-holes for lift pins to be inserted are formed as necessary. In addition, guide channels for wiring the lead wires L i.e., guide channels in which the lead wires L are housed may be formed on the underside of the ceramic base plate 10. In this case, the lead wires L may be wired along the respective guide channels.

As described above, according to the substrate heating device 1 of the first embodiment, since the lead wires L are not buried in the ceramic base plate 10, and are wired on the outer surface other than the heating surface 11 of the ceramic base plate 10 instead, more specifically, on the underside of the ceramic base plate 10 (the opposite surface to the heating surface 11), a conductor with lower resistance such as a fine metallic wire made of nickel, aluminum or the like, different than materials of the resistance heating elements 30, may be used. This can prevent influences of the lead wires. More specifically, the lead wires L are not defects of the ceramic base plate 10. In addition, since heat generation of lead wires themselves may be prevented, and it is possible to achieve further precise temperature control for respective zones on the heating surface 11.

Therefore, the substrate heating device 1 may be preferably used as a substrate heating device for heating a semiconductor substrate, a liquid crystal substrate, or the like in a semiconductor manufacturing process, a liquid crystal manufacturing process, or the like. For example, even when it is available over a wide range of temperatures from room temperature to a high temperature of 400° C. or greater for applications, the substrate heating device 1 may accurately control temperatures for respective zones by regulating the heating values for the respective zones into certain optimal values, allowing extremely precise temperature uniformity of the heating surface 11.

Figure 3:
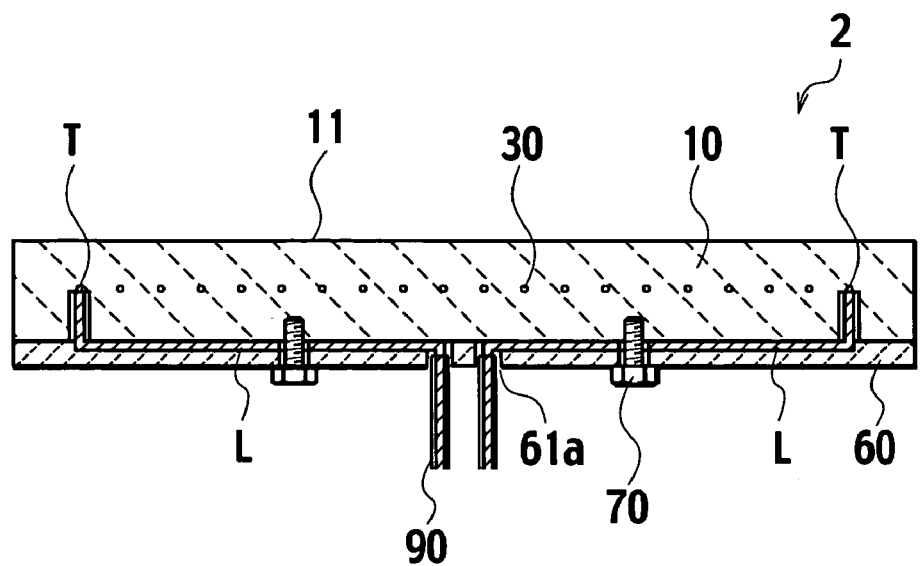
FIG. 3 is a sectional view of a substrate heating device according to a second embodiment of the present invention.

FIG. 3 shows a sectional view of a substrate heating device 2 according to a second embodiment of the present invention. The substrate heating device 2 according to the second embodiment of the present invention includes an auxiliary plate 60, which is an isolating auxiliary member, provided on the underside, i.e., the opposite surface to the heating surface 11, of the ceramic base plate 10 of the substrate heating device 1 shown in FIG. 1. The structure thereof, other than the auxiliary plate 60, is substantially the same as that of the substrate heating device 1 shown in FIG. 1. In other words, the substrate heating device 2 is a multi-zone heater in which multiple resistance heating elements 30 are buried. Lead wires L connected to terminals T of the respective heating resisters are not buried in the ceramic 10, and are wired on the underside thereof instead. The auxiliary plate 60 is provided on the underside of the ceramic base plate 10, so as to cover the lead wires L.

Figure 4A:
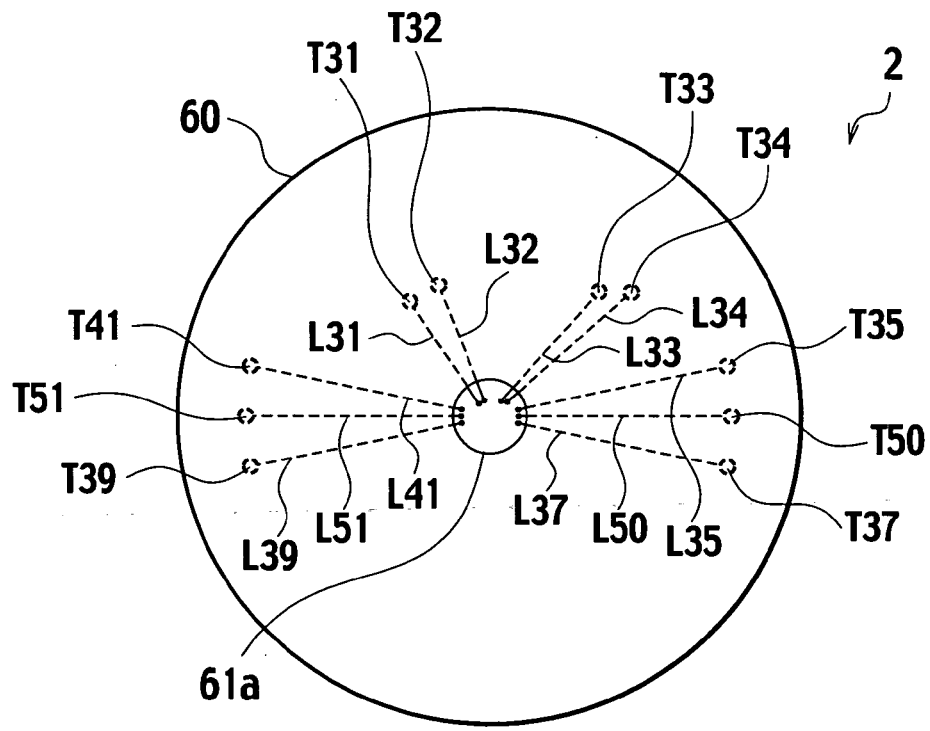
FIGS. 4A and 4B are plan views showing the underside of the substrate heating device according to the second embodiment of the present invention.

FIG. 4A is a plan view showing the underside of the substrate heating device 2. The auxiliary plate 60 placed on the underside of the ceramic base plate 10 is a disc having almost the same size as the underside of the ceramic base plate 10. The auxiliary plate 60 includes an aperture 61a at the central region thereof to externally extend the lead wires L. The lead wires L wired on the underside of the ceramic base plate 10 are covered by the auxiliary plate 60.

Accordingly, providing the auxiliary plate 60 allows the lead wires wired to be fixed on the underside of the ceramic base plate 10. In addition, since the auxiliary plate 60 can cover the lead wires L, the lead wires L can be protected from the surrounding environment with a simple structure, even when the lead wires L are not buried in the ceramic base plate 10. For example, corrosion of the lead wires L may be prevented in a simple way. More specifically, since the auxiliary plate 60 covers the lead wires L, the substrate heating device 2 may be used without exposing the lead wires L. This allows the substrate heating device 2 to be used in various gaseous environments, such as a corrosive gas atmosphere. The material of the lead wires L is not limited to corrosion-proof materials, even for applications in a corrosive gas atmosphere, and the lead wires L may be made of various materials.

Furthermore, as shown in FIG. 3, the lead wires L extending from the aperture 61a, which is formed at the central region of the auxiliary plate 60, and the power supply member connected to the lead wires L may be housed in an insulating tube 90. The insulating tube 90 may be inserted into the aperture 61a of the auxiliary plate 60, for example.

Figure 4B:
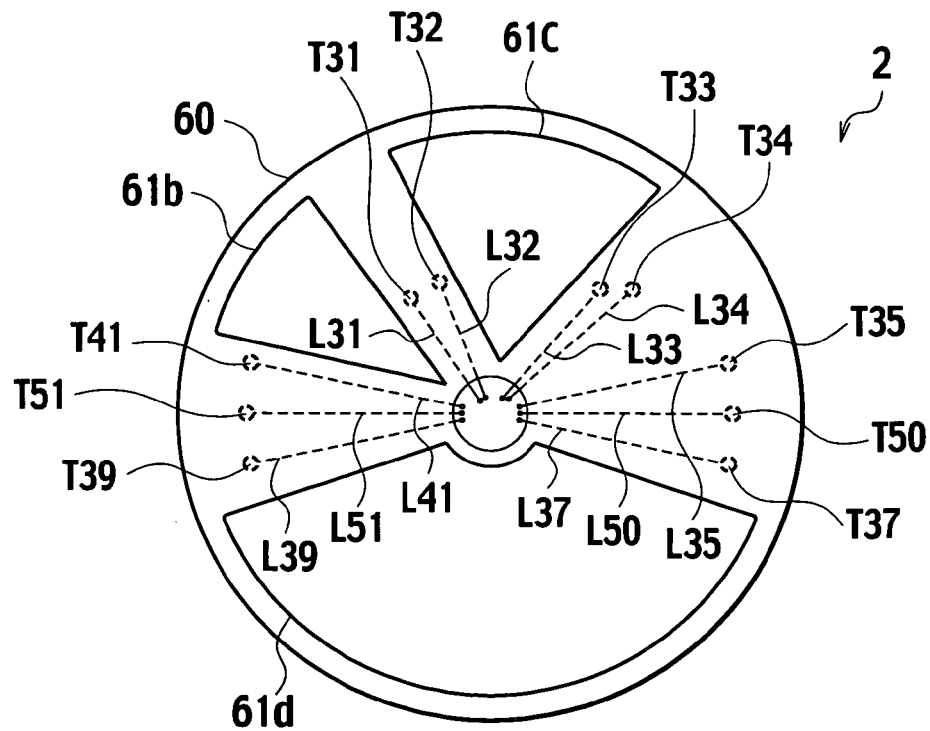

Note that the auxiliary plate 60 is not limited to a disc of almost the same size as the underside of the ceramic base plate 10 (not limited to the same shape as the ceramic base plate 10), as long as it can cover the lead wires L. Therefore, as shown in FIG. 4B, for example, apertures 61b through 61d may be formed at portions where there are no lead wires L. FIG. 4B is a plan view showing the underside of a substrate heating device 2.

The material of the auxiliary plate 60 is not particularly limited as long as it is insulating and has sufficient heat resistivity in an allowable temperature range of the substrate heating device 2. For example, when it is used at a relatively low temperature of 300° C. or less, an engineering plastic material such as polyimide, polyether-ether-ketone, or the like may be used. On the other hand, when it is used at a high-temperature atmosphere of 400° C. or greater, it is preferable that the auxiliary plate 60 includes ceramics such as alumina, aluminum nitride, silicon nitride, silicon carbide, mullite, boron nitride, sialon or the like. In addition, it is preferable to use ceramics with the same main ingredient as the ceramic base plate 10. This prevents thermal stress from generating due to difference in thermal expansion coefficient at the junction with the ceramic base plate 10.

Figure 5A:
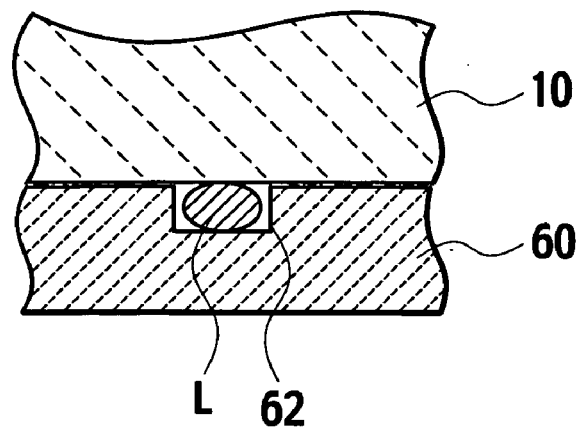
FIGS. 5A and 5B are respective partial sectional views showing a channel formed in an auxiliary plate or a ceramic base plate of the substrate heating device according to the second embodiment of the present invention.
Figure 5B:
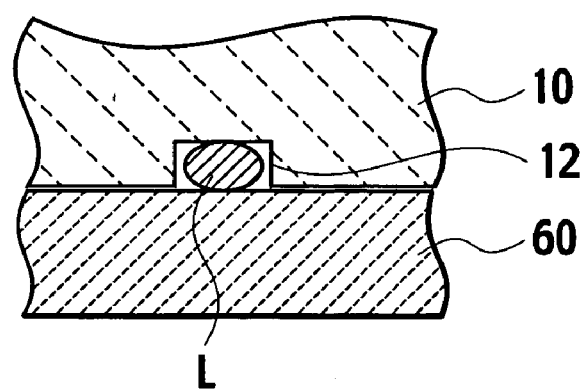

Furthermore, as shown in FIG. 5A, the auxiliary plate 60 may have a guide channel 62 for wiring lead wires L. The lead wires L is housed in the guide channel 62. In addition, as shown in FIG. 5B, the ceramic base plate 10 may have a guide channel 12 for housing the lead wires L on the underside thereof instead of in the auxiliary plate 60.

It is preferable that the auxiliary plate 60 is screwed to the ceramic base plate 10. In other words, it is preferable that the auxiliary plate 60 is screwed to the ceramic base plate 10 with bolts 70, as shown in FIG. 3. In this case, through-holes for the bolts 70 may be formed in the auxiliary plate 60, and the ceramic base plate 10 have internal threads for the bolts 70. Use of such screwing method allows simplification of the bonding process, thereby facilitating overhaul.

When used in a corrosive gas atmosphere, or when used at a high temperature of 200° C. or greater, it is preferable to use bolts made of a Ni base alloy, such as Inconel, or carbon or ceramics. It is preferable that the ceramic base plate 10, the auxiliary plate 60, and the bolts 70 are made of the same ceramic, for example, aluminum nitride. This can prevent thermal stress due to a difference in thermal expansion coefficient among them.

In addition, when a Ni base alloy is used, a 'helisert' (helical coil wire screw thread insert) made of Ni base alloy should be inserted in the internal threads of the ceramic base plate 10. This can prevent chipping of the internal threads of the ceramic base plate 10, since torque of screwing can evenly work on the internal threads due to inserting the heliscrt made of elastic material. Note that it is preferable to use a 'sacrificial material' cover, which slows down corrosive gas entry due to activated reaction with corrosive gas, so as to protect metal bolts 70 from a corrosive gas atmosphere.

In addition, providing a circular ring or a gasket at the interface between the ceramic base plate 10 and the auxiliary plate 60 secures airtightness. As a result, the lead wires L may be almost completely isolated from the corrosive gas atmosphere. In addition, the auxiliary plate 60 may be fixed to the ceramic base plate 10 by solid-state welding, solid-liquid-state welding, soldering or the like, in addition to using tightening screws.

When manufacturing the auxiliary plate 60 made of ceramics such as aluminum nitride, a sintered body should be provided by forming and sintering ceramic powder, and then processing it, as described in the manufacturing method for the ceramic base plate 10 according to the first embodiment. In addition, the auxiliary plate 60 made of a resin material may be provided by processing or forming the resin material into a disc shape.

According to the substrate heating device 2 of the second embodiment, since the lead wires L are not buried in the ceramic base plate 10, and are wired on an outer surface other than the heating surface 11 instead, more specifically, on the underside (the opposite surface to the heating surface 11) of the ceramic base plate 10, resistance conductors with a lower resistance, such as a fine wire made of nickel, aluminum or the like, that is different from the material of the resistance heating elements 30 can be used. This can prevent influences of the lead wires. More specifically, the lead wires L are not defects of the ceramic base plate 10. In addition, since heat generation of lead wires themselves may be prevented, it is further possible to achieve precise temperature control for respective zones on the heating surface 11.

In addition, the auxiliary plate 60 provided on the underside of the ceramic base plate 10 may cover the lead wires L. This allows fixation of the lead wires L wired on the underside of the ceramic base plate 10, and prevention of the lead wires L from being exposed. Accordingly, for example, it is possible to prevent corrosion of the lead wires even in a corrosive gas atmosphere. Therefore, for example, the substrate heating device 2 may be preferably used in a CVD apparatus or a dry etching apparatus often using a corrosive gas.

Figure 6:
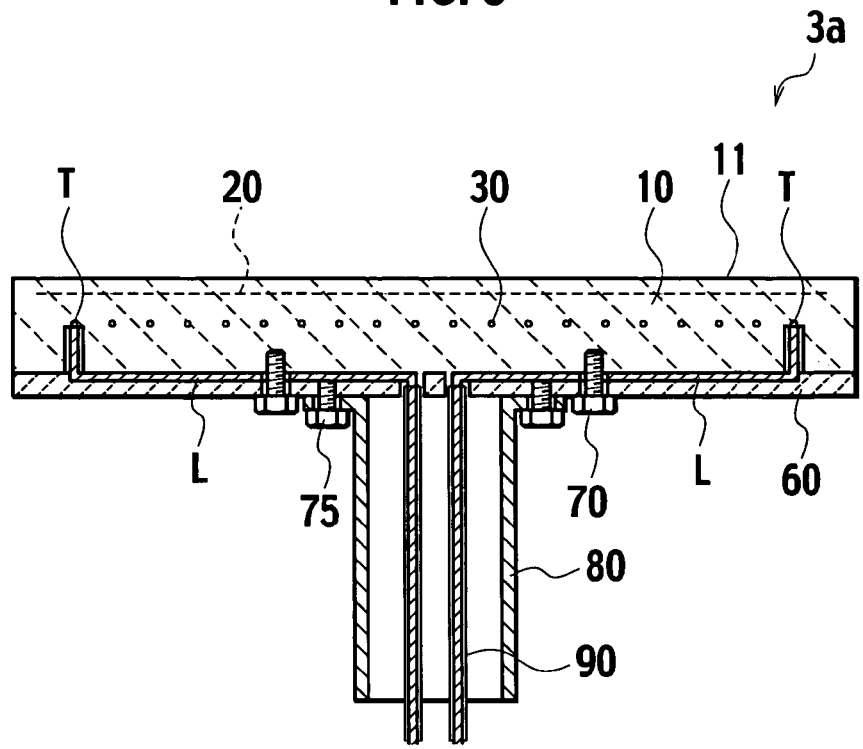
FIG. 6 is a sectional view of a substrate heating device according to a third embodiment of the present invention.

FIG. 6 shows a sectional view of a substrate heating device 3a according to a third embodiment of the present invention. The substrate heating device 3a according to the third embodiment of the present invention includes a tubular member 80 on the underside of the ceramic base plate 10 (i.e., the opposite surface to the heating surface 11) in the substrate heating device shown in FIG. 3. The structure thereof other than the tubular member 80 is the same as that of the substrate heating device 2. In other words, the substrate heating device 3a is a multi-zone heater in which multiple resistance heating elements 30 are buried. In addition, lead wires L connected to terminals of the respective resistance heating elements 30 are wired on the underside of the ceramic base plate 10. Furthermore, the auxiliary plate 60 is provided on the underside of the ceramic base plate 10.

The tubular member 80 houses part of lead wires L and power supply member such as a power supply line or a power supply rod, and supports the ceramic base plate 10. Therefore, it is preferable that the tubular member 80 is made of a rigid body such as ceramics or metal. In other words, it is preferable that the tubular member 80 includes at least one of metal or ceramics. Note that the tubular member 80 may be fixed to the chamber wall, when the substrate heating device 3a is arranged in a chamber of a dry etching apparatus. In particular, when the tubular member 80 is made of a corrosion-proof material such as ceramics or the like, corrosion of the lead wires L and power supply member connected to the respective lead wires L which are housed in the tubular member 80 may be prevented. More specifically, corrosion of the lead wires L and power supply member may be further certainly prevented by sealing the edge of the tubular member 80 or purging the inside of the tubular member 80 with an inert gas. In addition, it is preferable that the plate 10, the auxiliary plate 60, and the tubular member 80 are made of the same ceramic material such as aluminum nitride. This can prevent thermal stress due to a difference in the thermal expansion coefficients among them.

The tubular member 80 is connected to the central region of the underside of the ceramic base plate 10 (i.e., the opposite surface to the heating surface 11) via the auxiliary plate 60. The tubular member 80 may be screwed to the auxiliary plate 60. For example, the tubular member 80 made of ceramics may be fixed to the auxiliary plate made of ceramics with bolts 75 or the like. In this case, internal threads for the bolts 75 are formed in the auxiliary plate 60. It is preferable that the bolts 75 are made of the same ceramics, for example, aluminum nitride as with the auxiliary plate 60 and tubular member 80. This can prevent thermal stress due to difference in thermal expansion coefficient at the junction. In addition, the tubular member 80 and the ceramic base plate 10 may be joined together by soldering or using adhesive.

Furthermore, the substrate heating device 3a shown in FIG. 6 includes an electrode 20, which is buried in the ceramic base plate 10 closer to the heating surface 11 than the resistance heating elements 30 in the ceramic base plate 10. An electrode for generating electrostatic chucking force or a high frequency electrode such as a radio frequency (RF) electrode may be used as the electrode 20. When an electrode generating electrostatic chucking force is buried as the electrode 20 in the ceramic base plate 10, the substrate heating device 3a is capable of functioning as an electrostatic chuck holding the substrate. As a result, since the substrate placed on the heating surface 11 may be fixed to the heating surface 11 with preferable adhesiveness, substrate temperature distribution reflecting uniformity of the heating surface 11 temperature maybe obtained. In addition, when an RF electrode is buried as the electrode 20 in the ceramic base plate 10, the substrate heating device 3a with the RF electrode capable of generating plasma may be provided.

A planar electrode may be used as the electrode 20, for example. In addition, the electrode 20 may be made of a refractory material such as molybdenum (Mo), tungsten (W), or tungsten carbide (WC). The form of the electrode 20 is not limited and may be made of a bulk of electrode material, a printed electrode formed by printing a printing paste including electrode material, or a thin film of electrode material formed by CVD or PVD such as vapor deposition or sputtering. In addition, the shape of the electrode 20 may be a circular plate, a mesh, a perforated-shape or the like. Note that use of an electrode 20 which is bulk metal especially allows a reduction in resistance. Therefore, it can be used as an electrode for generating electrostatic chucking force and as an RF electrode for generating plasma. Note that such an electrode 20 is applicable to the substrate heating devices 1 and 2 according to the first and the second embodiment shown in FIGS. 1 and 3. In other words, in the substrate heating devices 1 and 2 shown in FIGS. 1 and 3, the electrode 20 may be buried in the ceramic base plate 10.

In addition, in the substrate heating device 3a shown in FIG. 6, the tubular member 80 and the auxiliary plate 60 are formed independently, and they are joined together by tightening of screws. Alternatively, as the substrate heating device 3b shown in FIG. 7, an auxiliary plate with a tubular member 100, which integrates the tubular member 80 and the auxiliary plate 60, may be used. The auxiliary plate with tubular member 100 is formed as a ceramic integrated sintered body of an auxiliary plate and a tubular member.

Figure 7:
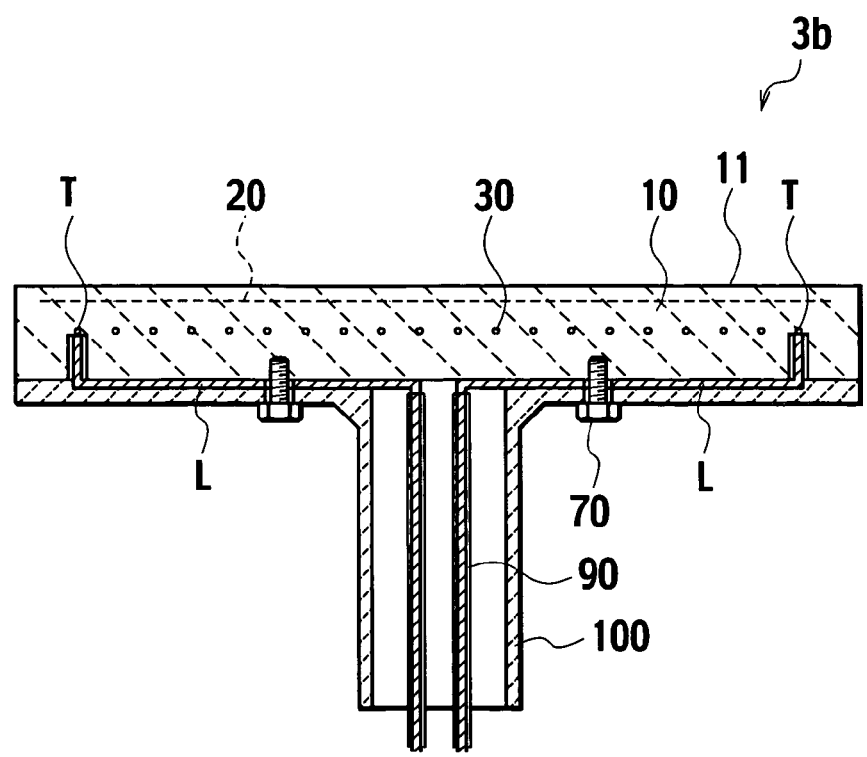
FIG. 7 is a sectional view of a substrate heating device according to the third embodiment of the present invention.

To form the tubular member 80 shown in FIG. 6 or the auxiliary plate with tubular member 100 shown in FIG. 7 by using ceramics, for example, the same material as the ceramic base plate 10, ceramic powder is formed and sintered into a sintered body and then processed in the same manner as the ceramic base plate 10 is formed.

Note that there are various forming methods for the tubular member 80 or the auxiliary plate with tubular member 100; however, it is preferable to use a cold isostatic pressing (CIP) method or a slip cast method, which is suitable for forming a relatively intricately shaped compact. In addition, it is preferable to use atmospheric sintering because of intricate compact shapes. For example, in the case of using AlN as the ceramic material, it is sintered for about one to about ten hours at a temperature of about 1700° C. to about 2000° C. in a nitrogen atmosphere. In a processing step, a sintered body surface is lapped. In the case of the tubular member 80, the joining surface with the auxiliary plate 60 is lapped. The tubular member 80 is then screwed to the auxiliary plate 60, as shown in FIG. 6. In this case, the lead wires L collectively wired in the central region of the underside of the ceramic base plate 10 are housed in the tubular member 80. In addition, the lead wires L may externally extend through the tubular member 80 and may be used as a power supply member as they are or connected to the power supply member.

To form the tubular member 80 using metal, it may be formed by polishing a metallic tube. In addition, when the tubular member 80 is made of a metallic material, it is preferable to house the lead wires L in the insulating tube 90 made of alumina or the like so as to secure insulation, as shown in FIG. 6.

Note that the tubular member 80 is not necessarily connected to the auxiliary plate 60. It may be connected to a device without the auxiliary plate 60 as with the substrate heating device 1 shown in FIG. 1. In this case, the tubular member 80 may be connected to the underside of the ceramic base plate 10 (i.e., the opposite surface to the heating surface 11). For example, the tubular member 80 may be directly connected to the central region of the underside of the ceramic base plate 10 by screwing or sintering. In addition, the tubular member 80 may be indirectly connected to the underside of the ceramic base plate 10 via a member such as an auxiliary plate shown in FIG. 6.

According to the substrate heating devices 3a and 3b of the third embodiment, since the lead wires L are not buried in the ceramic base plate 10, and are wired on the outer surface other than the heating surface 11 instead, more specifically, on the underside of the ceramic base plate 10 (i.e., the opposite surface to the heating surface 11), a conductor having a lower resistance such as a fine wire made of nickel, aluminum or the like, different than a material of the resistance heating elements 30, may be used. This can prevent influences of the lead wires. More specifically, the lead wires L are not defects of the ceramic base plate 10. In addition, since heat the generation of the lead wires themselves may be prevented, it is further possible to achieve precise temperature control for the respective zones on the heating surface 11.

In addition, the auxiliary plate 60 provided on the underside of the ceramic base plate 10 may cover the lead wires L. This allows fixation of the lead wires L wired on the underside of the ceramic base plate 10, and prevention of lead wires L from being exposed. Accordingly, for example, it is possible to prevent corrosion of the lead wires even in a corrosive gas atmosphere. Furthermore, since the substrate heating devices 3a and 3b include the tubular member 80, the ceramic base plate 10 may be supported, and the lead wires L and power supply member connected to the lead wires L may be housed in the tubular member 80. Accordingly, it is possible to prevent corrosion of the lead wires and power supply member.

Note that structures in which the auxiliary plate 60 and the tubular member 80 may be attached are not limited to a substrate heating device used in a corrosive gas atmosphere.

Although the inventions have been described above by reference to certain embodiments of the inventions, the inventions are not limited to the embodiments described above. Modifications and variations of the embodiments described above will occur to those skilled in the art, in light of the above teachings.

What is claimed is:

1. A substrate heating device, comprising:
   a sintered ceramic base plate having a heating surface on which a substrate is placed;
   resistance heating elements buried in the sintered ceramic base plate corresponding to a plurality of zones into which the heating surface is divided;
   terminals connected to the resistance heating elements respectively;

lead wires connected to the respective terminals respectively and wired on an outer surface of the sintered ceramic base plate opposing the heating surface; and a sintered isolating auxiliary member attached to the sintered ceramic base plate by screws to cover the lead wires on the outer surface of the sintered ceramic base plate opposing the heating surface.

2. The substrate heating device of claim 1, wherein the sintered isolating auxiliary member comprises a ceramic.

3. The substrate heating device of claim 1, wherein the sintered isolating auxiliary member has a guide channel for wiring the lead wires.

4. The substrate heating device of claim 1, further comprising a tubular member connected to the surface of the sintered ceramic base plate opposing the heating surface via the sintered isolating auxiliary member.

5. The substrate heating device of claim 4, wherein the tubular member is screwed to the sintered isolating auxiliary member.

6. The substrate heating device of claim 4, wherein the sintered isolating auxiliary member and the tubular member are an integrated ceramic sintered body.

7. The substrate heating device of claim 1, further comprising a tubular member connected to a surface of the sintered ceramic base plate opposing the heating surface.

8. The substrate heating device of claim 4, wherein the tubular member comprises at least one of a metal and a ceramic.

9. The substrate heating device of claim 1, further comprising an electrode buried in the sintered ceramic base plate interposed between the heating surface and the resistance heating elements.

10. The substrate heating device of claim 1, wherein the sintered ceramic base plate comprises aluminum nitride.

11. The substrate heating device of claim 1, wherein the resistance heating elements comprise at least one of molybdenum and tungsten.

12. The substrate heating device of claim 1, wherein the lead wires comprise one of nickel wires and aluminum wires.

13. The substrate heating device of claim 1, wherein the plurality of zones into which the heating surface is divided includes a first zone in a central region, a second zone arranged around a peripheral portion of the first zone, and a plurality of third zone groups equally divided along a circumferential direction around a peripheral portion of the second zone.

* * * * *